United States Patent
Ozono et al.

(10) Patent No.: US 6,605,315 B1
(45) Date of Patent: Aug. 12, 2003

(54) BONDING PASTE APPLICATOR AND METHOD OF USING IT

(75) Inventors: Mitsuru Ozono, Fukuoka (JP); Seiichi Sato, Fukuoka (JP); Nobuyuki Suefuji, Fukuoka (JP); Nobuyuki Iwashita, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 27 days.

(21) Appl. No.: 09/704,728

(22) Filed: Nov. 3, 2000

(30) Foreign Application Priority Data

Nov. 5, 1999 (JP) .............................. 11-315181
Jul. 18, 2000 (JP) ........................... 2000-216945

(51) Int. Cl.⁷ .............................. B05D 5/10; B05D 1/42
(52) U.S. Cl. ...................... 427/96; 427/207.1; 427/287; 438/118; 118/669; 118/323; 29/832; 156/356; 156/357
(58) Field of Search .................. 427/287, 96, 208.6, 427/208.2, 207.1; 438/118; 118/668, 669, 679, 680, 681, 323; 29/832, 833; 156/356, 357

(56) References Cited

U.S. PATENT DOCUMENTS

| | | | | |
|---|---|---|---|---|
| 5,114,752 A | * | 5/1992 | Hall | 427/207.1 |
| 5,505,777 A | * | 4/1996 | Ciardella et al. | 118/302 |
| 6,348,234 B1 | * | 2/2002 | Ozono et al. | 156/356 |
| 6,361,831 B1 | * | 3/2002 | Sato et al. | 156/349 |

FOREIGN PATENT DOCUMENTS

| | | |
|---|---|---|
| JP | 5-185005 | 7/1993 |
| JP | 10-221698 | 8/1998 |
| JP | 11-168111 | 6/1999 |
| JP | 2000-294575 A | * 10/2000 |

* cited by examiner

Primary Examiner—Shrive P. Beck
Assistant Examiner—Kirsten Crockford Jolley
(74) Attorney, Agent, or Firm—McDermott, Will & Emery

(57) ABSTRACT

The object of the present invention is to provide a bonding paste applicator and a method of applying a bonding paste which allow satisfactory paste applying quality and excellent operability to be realized. A bonding paste application method for applying a bonding paste by making a drawing with a paste applying nozzle made to move to a position, where a chip is mounted on a substrate, comprises the steps of storing in advance in a storing unit 46 a drawing pattern for controlling each of X, Y and Z axes to move a paste applying nozzle and a drawing pattern setting table 53 to show a category corresponding to the size of a chip to be bonded, selecting a drawing pattern corresponding to the size of the chip, which has been designated, by means of a drawing pattern selecting unit 54 and obtaining a speed pattern for each of the X, Y and Z axes based on the selected drawing pattern by means of a speed pattern computing unit 55. Accordingly, it is no longer required to set up a drawing pattern every time occasion demands and a paste can be applied properly with excellent paste applying quality and satisfactory operability without fail.

11 Claims, 14 Drawing Sheets

F I G. 1
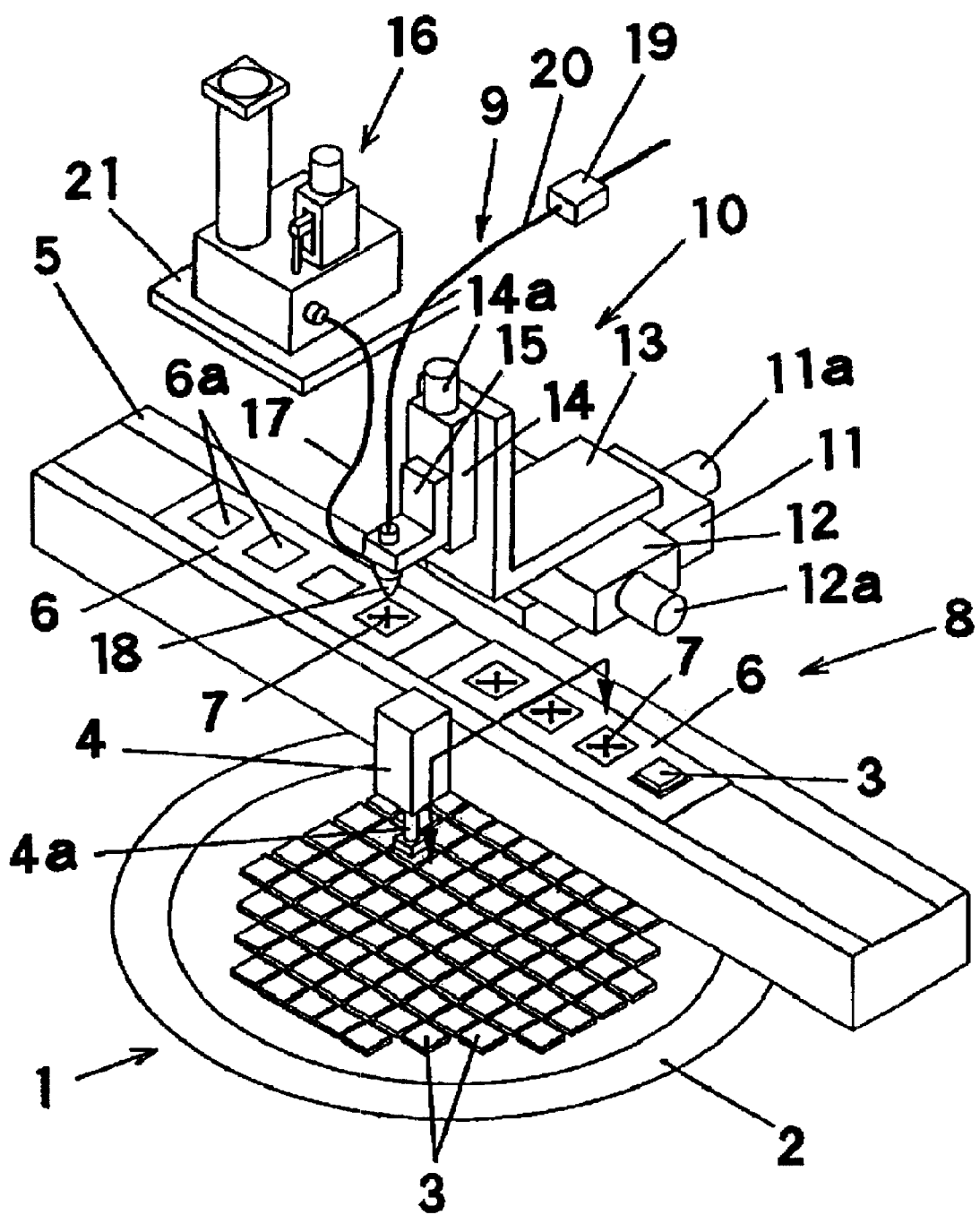

FIG. 7
(a)
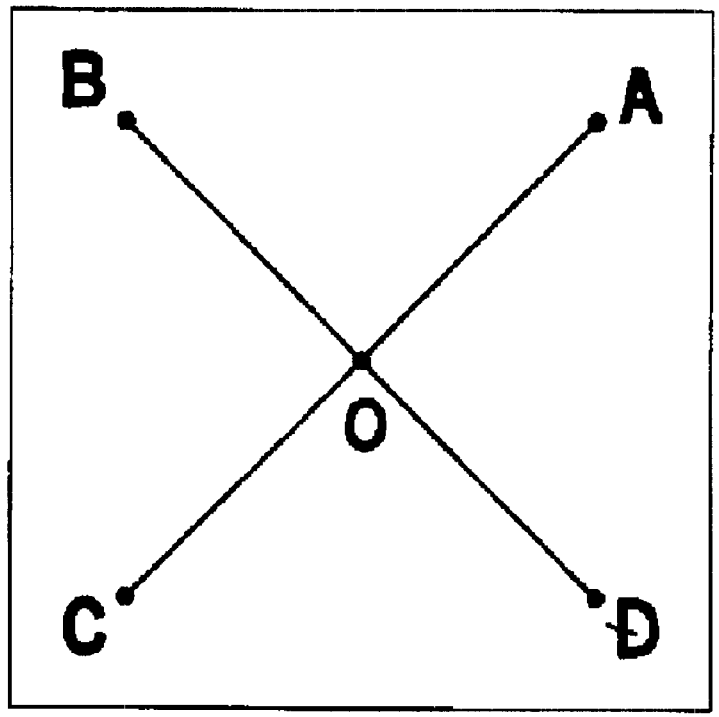
(b)
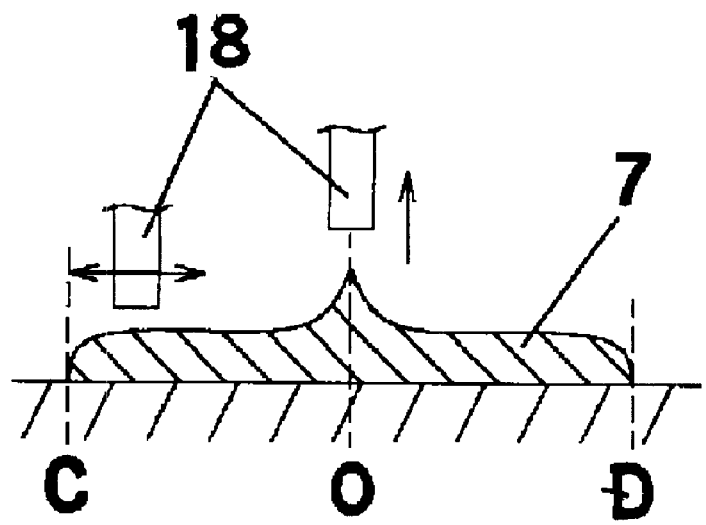

F I G. 9
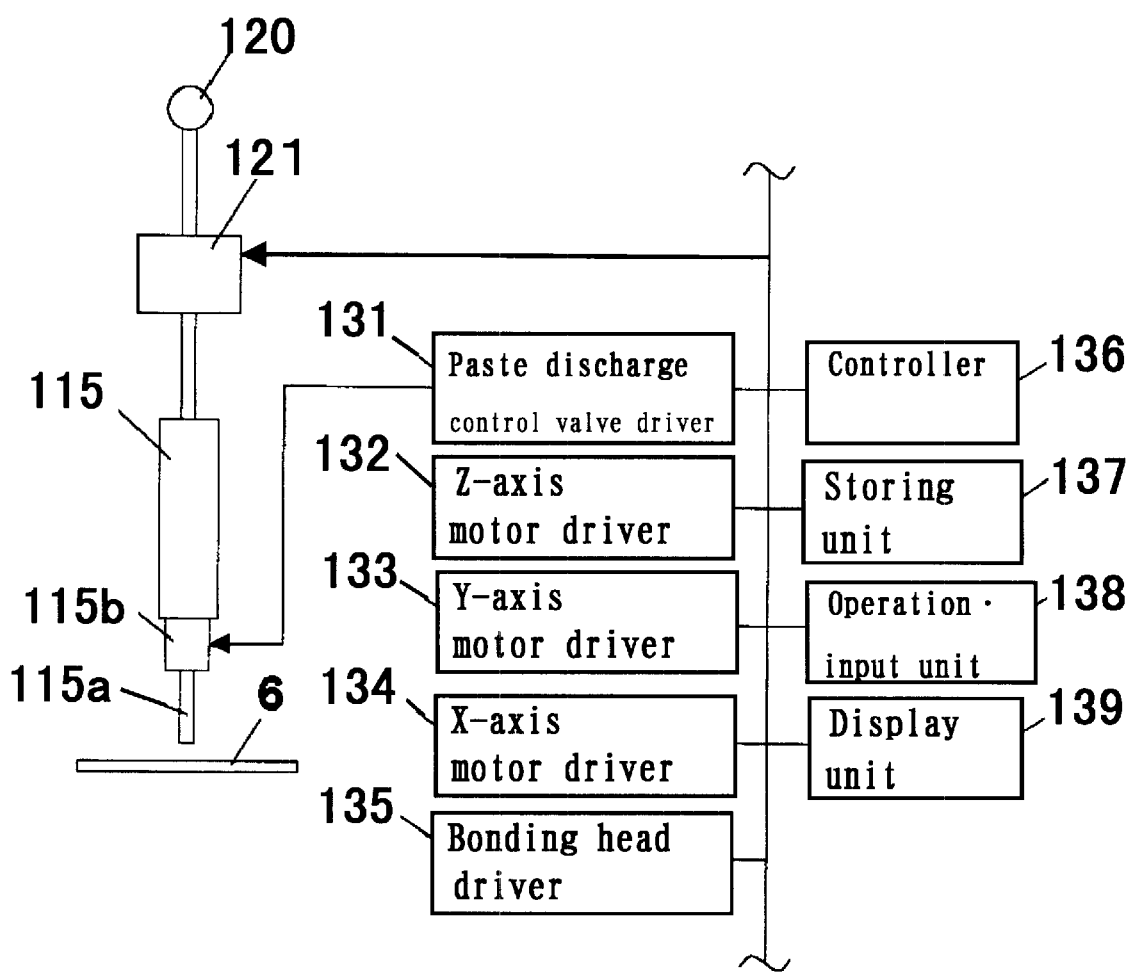

| | Center dot | Cross with Center dot | Asterisk with Center dot | Snow star |
|---|---|---|---|---|
| (a) Basic configu-ration pattern | • | ✕ | ✳ | ❄ |

(b)

FIG. 14
(a)
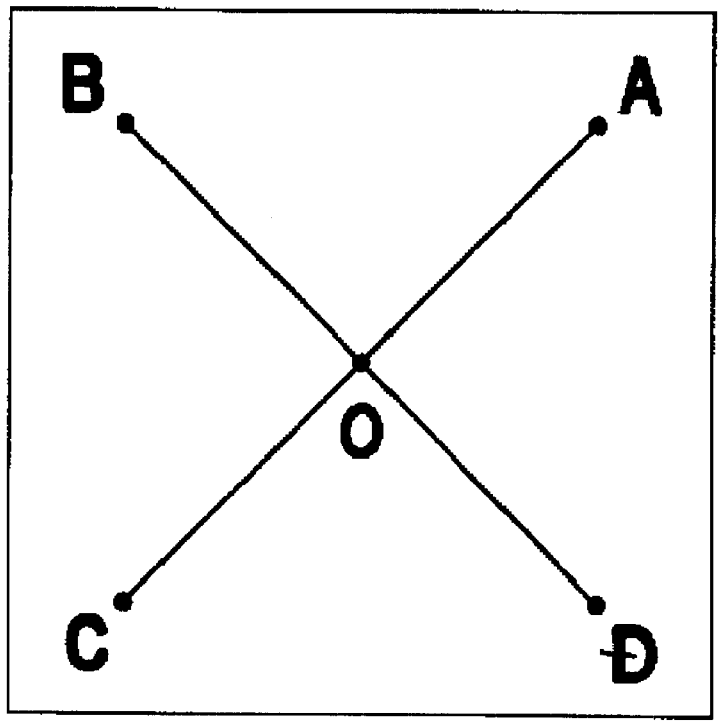
(b)
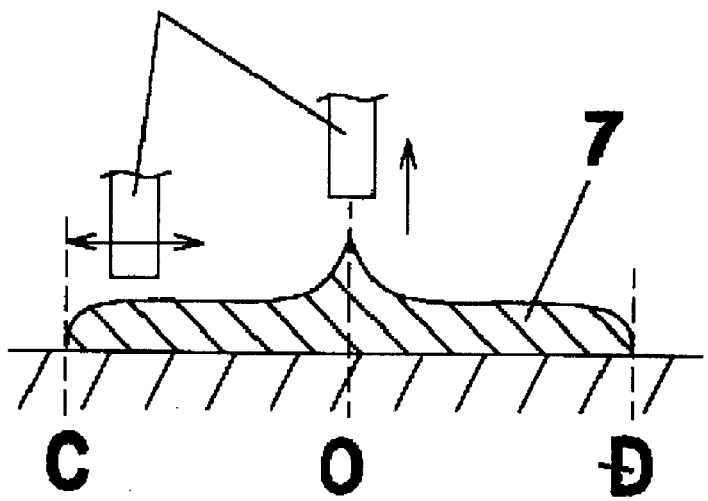

BONDING PASTE APPLICATOR AND METHOD OF USING IT

FIELD OF THE INVENTION

The present invention deals with a bonding paste applicator to apply a bonding paste for chip bonding on a substrate and a method of using the bonding paste applicator.

BACKGROUND OF THE INVENTION

In the die bonding process of a method for fabricating semiconductor devices, a bonding paste is applied to a substrate and the like including a lead frame to bond semiconductor chips thereon. A method of applying a bonding paste generally comprises the steps of guiding the bonding paste discharged from a paste dispenser to a paste applying nozzle and applying the bonding paste to a paste applying area through the paste applying nozzle. One of the methods for applying a paste is known as a paste applying method by making a drawing, whereby the paste is discharged from a paste applying nozzle while the paste applying nozzle being moved in a paste applying area.

With the aforementioned paste applying method by making a drawing, the required paste applying patterns differ from one another according to the configuration and size of each respective chip to be bonded on a lead frame and the like and, therefore, it is necessary for such paste applying conditions such as a drawing pattern at the time of drawing, a speed pattern in moving a paste applying nozzle and the like to be set up in according to the chips to be bonded. However, with a conventional bonding paste applicator, much expense in time and effort is needed in complicated data input and the like every time when paste applying conditions are set up to carry out the afore-mentioned paste applying method by making a drawing, thereby creating a problem of inferior operability and also an inability to achieve satisfactory paste applying quality when the paste applying conditions are not set up properly.

SUMMARY OF THE INVENTION

The object of the present invention is to provide a bonding paste applicator which allows satisfactory paste applying quality and excellent operability to be realized.

The other object of the present invention is to provide a bonding paste applicator and a method of forming a bonding paste by using the bonding paste applicator, thereby enabling excellent operability and satisfactory paste applying quality to be realized.

In order to achieve the foregoing objects, the present invention discloses a bonding paste applicator to apply a bonding paste by making a drawing with a paste applying nozzle made to move to a position, where a chip is mounted on a substrate, while a bonding paste being discharged from the paste applying nozzle, the bonding paste applicator comprising:

a paste applying nozzle to apply a bonding paste to a substrate by discharging the bonding paste from a bonding paste applying opening thereof;

a moving means to have the paste applying nozzle moved in a relative position against the substrate;

a controlling means to control the moving means based on a drawing pattern;

a storing means to store drawing patterns;

a drawing pattern selecting means to select a drawing pattern in accordance with the size of a chip; and a speed pattern setting means to set up a speed pattern of the moving means based on the selected drawing pattern.

The bonding paste applicator of the present invention is a bonding paste applicator to apply a bonding paste by making a drawing with a paste applying nozzle made to move to a position, where a chip is mounted on a substrate, while a bonding paste being discharged from the paste applying nozzle, comprising:

a paste applying nozzle to apply a bonding paste to a substrate by discharging the bonding paste from a bonding paste applying opening thereof;

a moving means to have the paste applying nozzle moved in a relative position against the substrate;

a drawing pattern producing means to produce a drawing pattern based on a basic configuration pattern of the drawing pattern and the size of a chip;

a speed pattern setting means to set up a speed pattern of the moving means based on the produced drawing pattern; and a driving means to drive the moving means based on the set up speed pattern.

The method of applying a bonding paste of the present invention is a method of applying a bonding paste by making a drawing with a paste applying nozzle made to move to a position, where a chip is mounted on a substrate, while a bonding paste being discharged from the paste applying nozzle, comprising the steps of:

selecting a drawing pattern for controlling a moving means, which makes the paste applying nozzle move, in accordance with the size of a chip; and setting up a speed pattern of the moving means based on the selected drawing pattern.

The method of applying a bonding paste of the present invention is a method of applying a bonding paste by making a drawing with a paste applying nozzle made to move to a position, where a chip is mounted on a substrate, while a bonding paste being discharged from the paste applying nozzle, comprising the steps of:

producing a drawing pattern for controlling a moving means, which makes the paste applying nozzle move, based on the basic configuration pattern of a drawing pattern and the size of a chip;

setting up a speed pattern of the moving means based on the produced drawing pattern; and discharging a bonding paste based on the speed pattern while the paste applying nozzle being kept moving.

According to the structure of the present invention as described in above, a drawing pattern is selected in accordance with the size of a chip and a speed pattern of the moving means of a paste applying nozzle is set up based on the selected drawing pattern, thereby no longer requiring a drawing pattern to be set up every time the kinds and sizes of chips are changed and yet allowing a proper paste application with excellent paste applying quality to be achieved with excellent operability without fail.

In addition, according to the structure of the present invention as described in above, a drawing pattern for controlling a moving means to move a paste applying nozzle is produced based on the basic configuration pattern of the drawing pattern and the size of a chip and a speed pattern of the moving means is set up based on the produced drawing pattern, thereby allowing a correct drawing pattern to be set up in accordance with the kinds and sizes of chips with excellent operability and enabling a proper paste application to be realized efficiently.

BRIEF DESCRIPTION OF THE DRAWINGS

FIG. 1 is a perspective view of a die bonding machine employing a bonding paste applicator in a first exemplary embodiment of the present invention.

FIG. 7(*a*) is a plan view of the paste applying area of the bonding paste applicator in the first exemplary embodiment of the present invention.

FIG. 7(*b*) is a cross-sectional view of the paste applying area of the bonding paste applicator in the first exemplary embodiment of the present invention.

FIG. 9 is a block diagram to show how the control system of the die bonding machine of FIG. 8 is structured.

FIG. 14(*a*) is a plan view of the paste applying area of the bonding paste applicator in the second exemplary embodiment of the present invention.

FIG. 14(*b*) is a cross-sectional view of the paste applying area of the bonding paste applicator in the second exemplary embodiment of the present invention.

DESCRIPTION OF THE PREFERRED EMBODIMENTS

First Exemplary Embodiment

Figure 3:
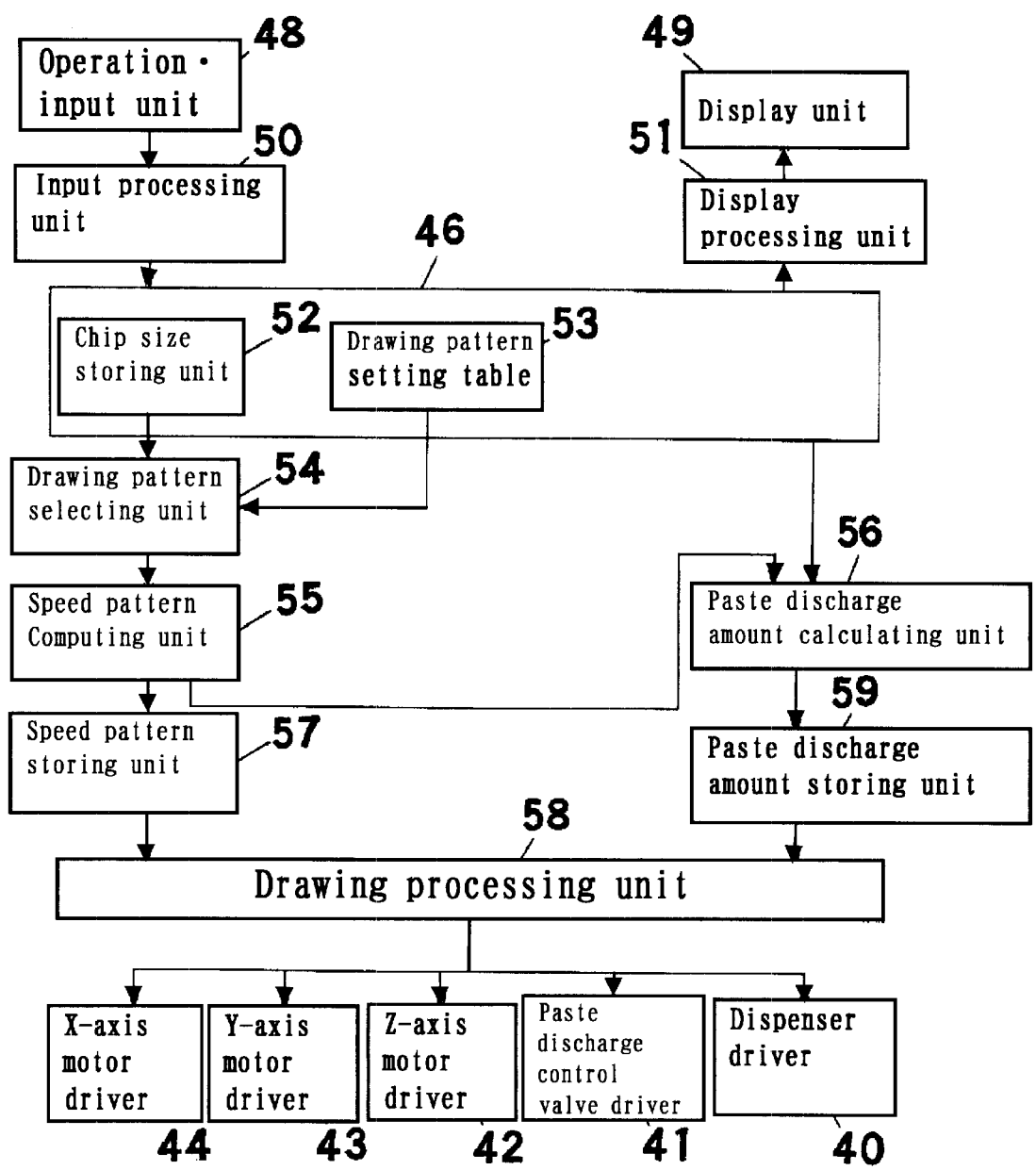
FIG. 3 is a functional block diagram to show the paste applying process of the die bonding machine of FIG. 1.
Figure 4:
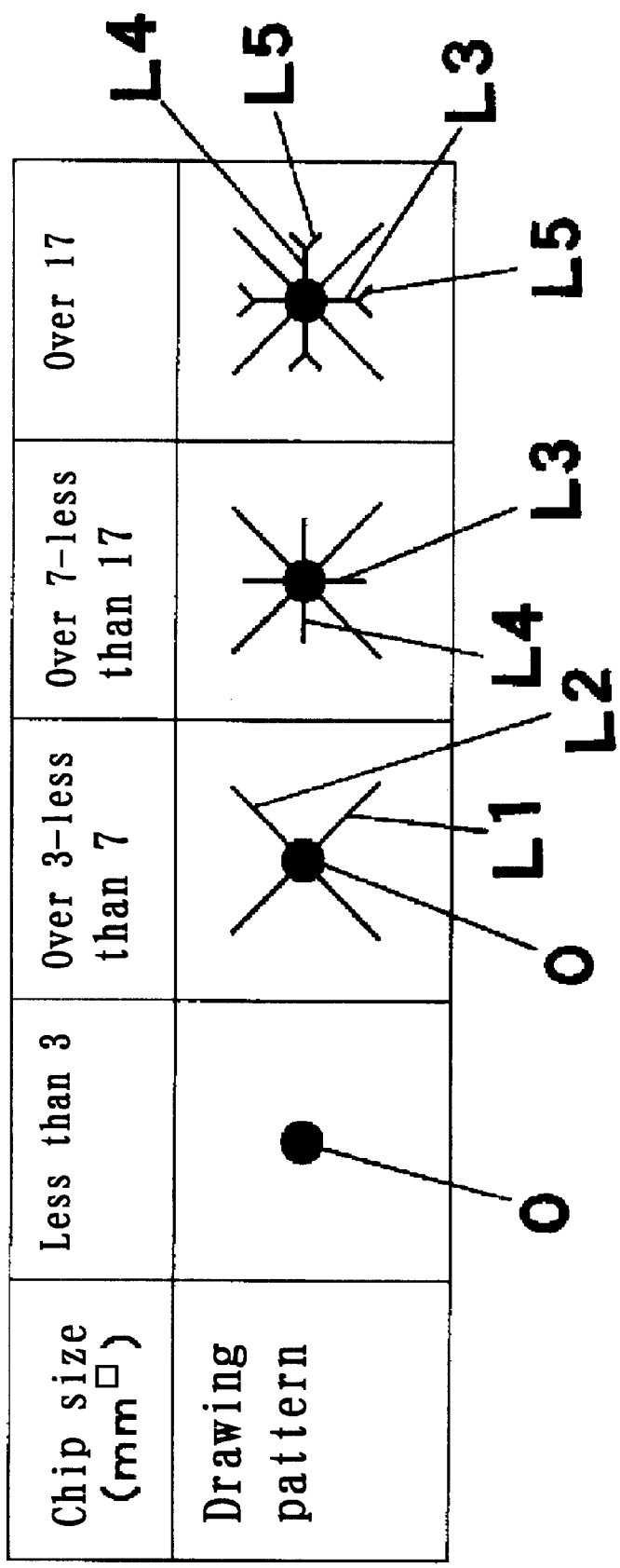
FIG. 4 is an illustration of the drawing pattern setting table as used by the bonding paste applicator in the first exemplary embodiment of the present invention.
Figure 5:
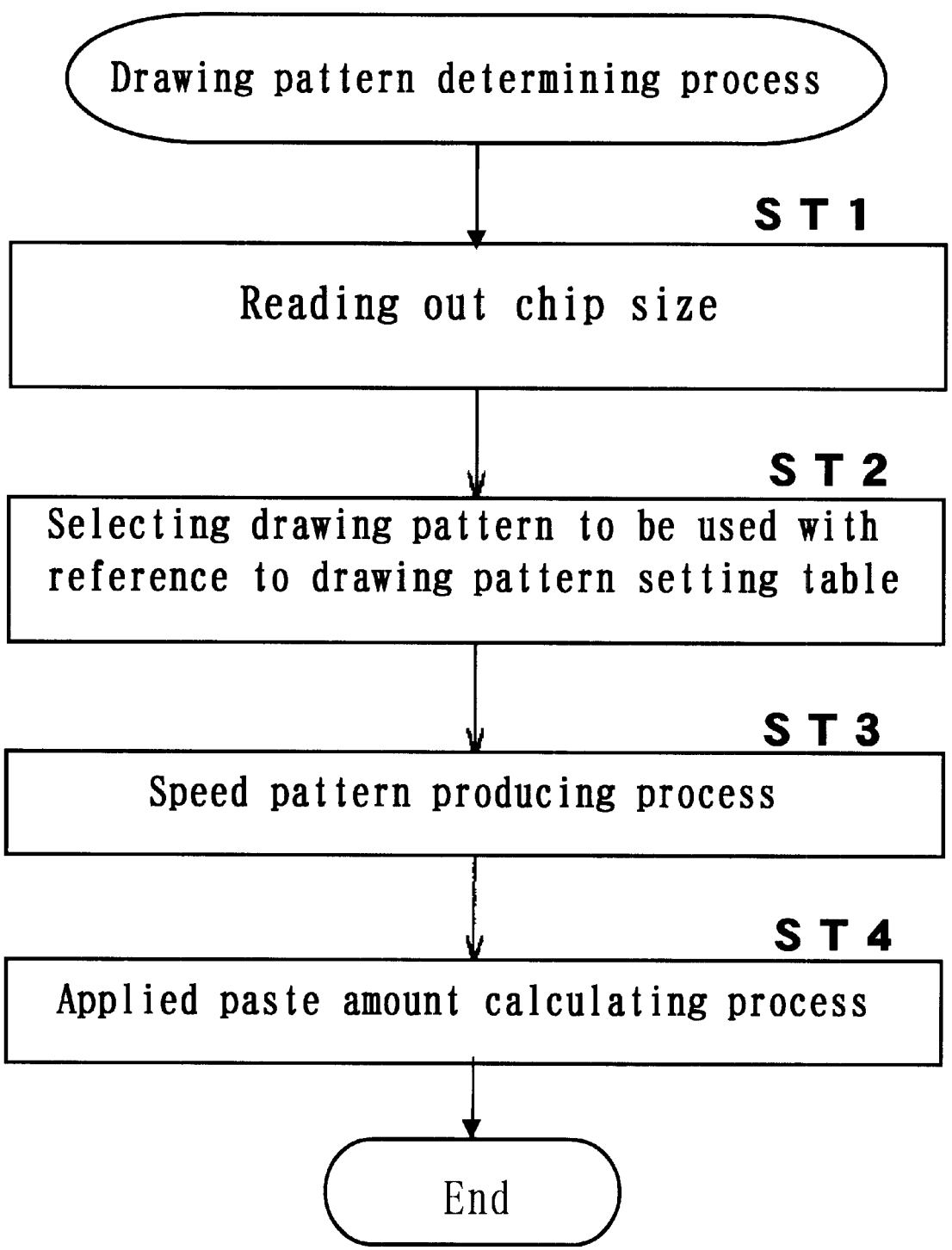
FIG. 5 is a flowchart of the drawing pattern determining process of the bonding paste applicator in the first exemplary embodiment of the present invention.
Figure 6:
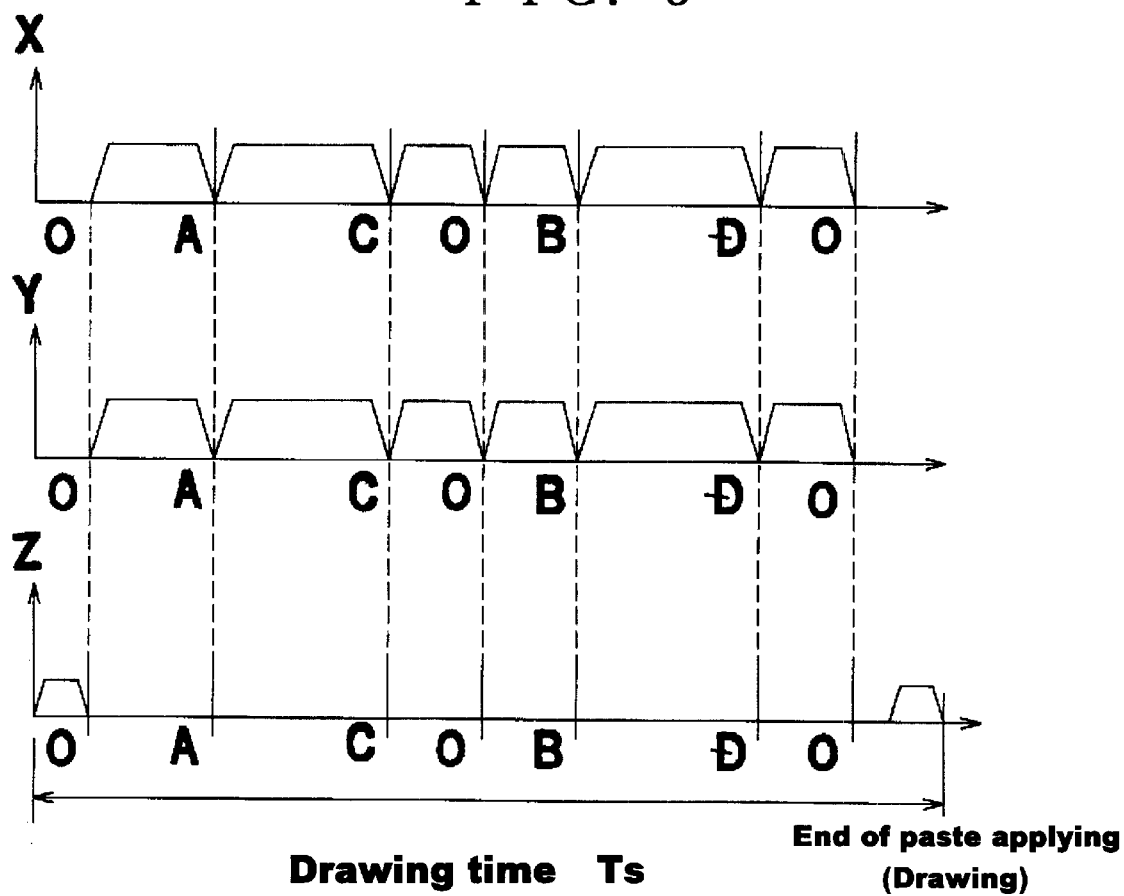
FIG. 6 is a diagram to show the speed pattern as used in making a drawing pattern for the bonding paste applicator in the first exemplary embodiment of the present invention.

Next, a description is given to a die bonding machine employing a bonding paste applicator in a first exemplary embodiment of the present invention with reference to drawings. FIG. 1 is a perspective view of the die bonding machine, FIG. 2 is a block diagram to show how the control system of the die bonding machine of FIG. 1 is structured, FIG. 3 is a functional block diagram to show the paste applying process of the die bonding machine of FIG. 1, FIG. 4 is an illustration of the drawing pattern setting table as applied to the bonding paste applicator in the first exemplary embodiment of the present invention, FIG. 5 is a flowchart of the drawing pattern setting process of the bonding paste applicator in the first exemplary embodiment of the present invention, FIG. 6 is a diagram to show the speed pattern as used in making a drawing pattern for the bonding paste applicator in the first exemplary embodiment of the present invention, FIG. 7(*a*) is a plan view of the paste applying area of the bonding paste applicator in the first exemplary embodiment of the present invention and FIG. 7(*b*) is a cross-sectional view of the paste applying area of the bonding paste applicator in the first exemplary embodiment of the present invention.

First, a description is made on the structure of the die bonding machine with reference to FIG. 1. As FIG. 1 shows, a wafer sheet 2 is held by a holding table (not shown in FIG. 1) in a chip feeder 1. Many chips, each being a semiconductor element, are placed on the wafer sheet 2 by sticking on the surface thereof On the side of the chip feeder 1 is installed a conveyor 5, which transports a lead frame 6 serving as a substrate and positions the lead frame 6 to a paste applying position and also to a bonding position. Above the chip feeder 1 is located a bonding head 4, which is moved horizontally as well as vertically by a moving means that is not shown in FIG. 1.

A paste applying unit 9 is disposed on the side of the conveyor 5. The paste applying unit 9 comprises a paste applying nozzle 18 and is attached to a moving table 10 via an L-shaped bracket 15. The paste applying nozzle 18 is coupled to a dispenser 16, which is fixed on an anchored plate 21 and acts as a paste discharging means, with a tube 17 formed of a flexible tubular material and further connected to a paste discharge controlling valve 19 via an air tube 20.

Figure 2:
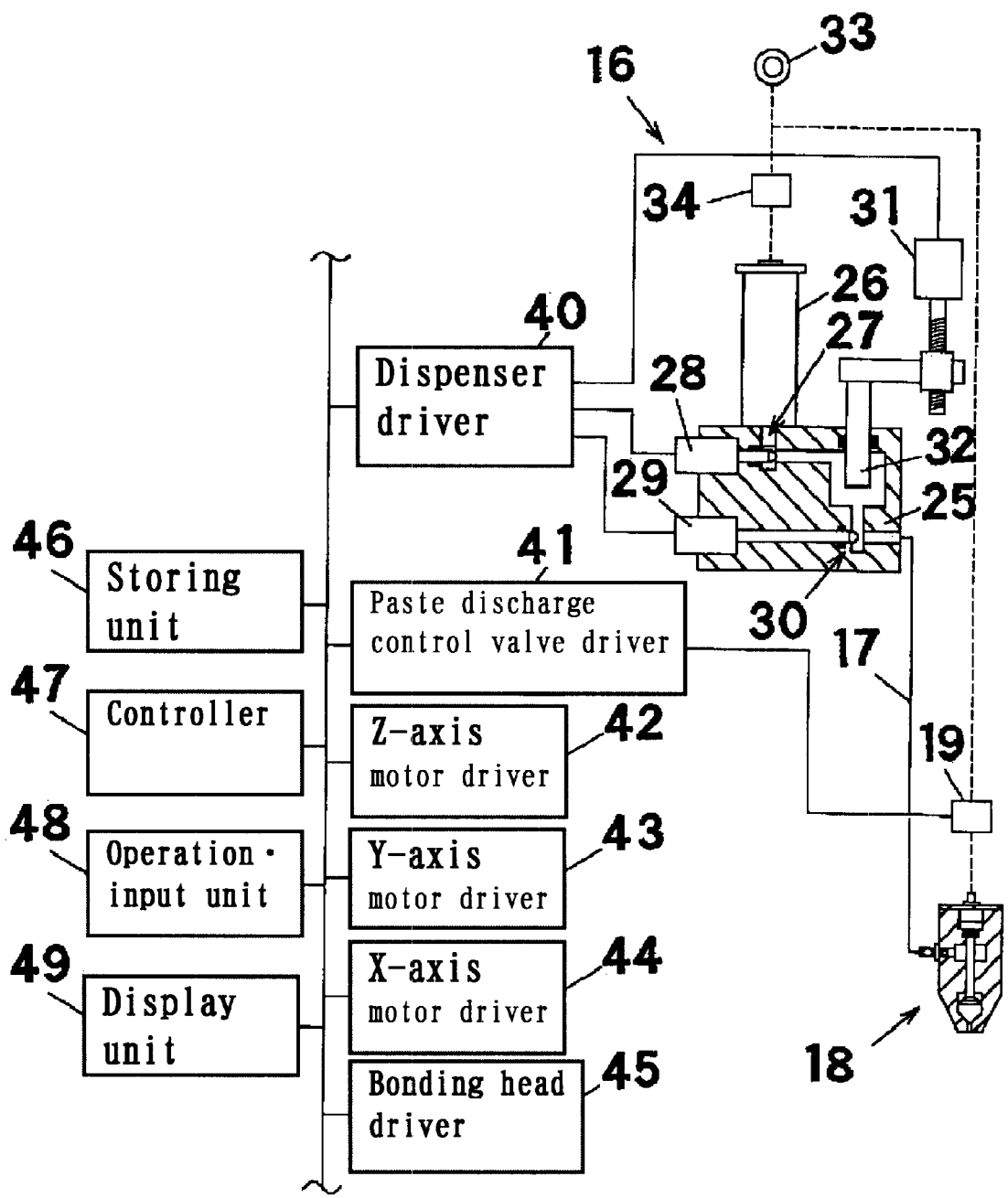
FIG. 2 is a block diagram to show how the control system of the die bonding machine of FIG. 1 is structured.

As FIG. 2 shows, the dispenser 16 has a paste 7 in a syringe 26 installed on the upper surface of a manifold block 25 discharged by the reciprocating movements of a piston 32 driven by a motor 31. Sucking and discharging of the paste 7 in and from the syringe 26, respectively, are controlled by a first valve 27 driven by a reciprocating drive mechanism 28 and a second valve 30 driven by a reciprocating drive mechanism 29.

The inner part of the syringe 26 is pressurized by air sent from an air source 33 via a valve 34 and, when the dispenser 16 is activated, the paste 7 is sent pressurized to the paste applying nozzle 18 via the tube 17, thereby allowing the paste 7 to be discharged through an orifice provided on the bottom end of the paste applying nozzle 18 and applied to a paste applying area 6*a* of the lead frame 6. Interruptions of the paste discharge from the paste applying nozzle 18 are controlled by the paste discharge control valve 19.

The moving table 10 is structured to have an X-axis table 12 stacked on a Y-axis table 11 and further to have a Z-axis table 14 stacked on the X-axis table 12 with an L-shaped bracket 13 disposed therebetween, all the foregoing elements being joined together vertically. The Y-axis table 11, X-axis table 12 and Z-axis table 14 are provide with a Y-axis motor 11*a*, X-axis motor 12*a* and Z-axis motor 14*a*, respectively. When the X-axis motor 12*a*, Y-axis motor 11*a* and Z-axis motor 14*a* are activated to rotate, the paste applying nozzle 18 is moved on the lead frame 6 horizontally and vertically, thereby making the moving table 10 serve as a moving means to change the relative position of the paste applying nozzle 18 against the lead frame 6.

The position, where a chip 3 is disposed on the upper surface of the lead frame 6, is in the paste applying area 6*a*, on which the paste 7 is applied. The paste applying nozzle 18 is made to locate inside of the paste applying area 6*a* and moved while the paste 7 being discharged therefrom, thereby allowing the paste 7 for chip bonding to be applied by making a drawing in the paste applying area 6a based on a predetermined drawing pattern.

After the paste 7 is applied as described in above, the lead frame 6 is carried on the conveyor 5 to a bonding position 8 and fixed in position there. The chip 3 picked up at the chip feeder 1 by a nozzle 4a of the bonding head 4 is placed on the paste 7 applied in the paste applying area 6a and bonded there.

Next, a description is given to how the control system of the die bonding machine is structured with reference to FIG. 2. In FIG. 2, a dispenser driver 40 rotates the motor to drive the piston 32 and drives the reciprocating drive mechanisms 28 and 29 to move to and from the first valve 27 and the second valve 30, respectively, thereby controlling the dispenser 16 in discharging the paste 7.

A paste discharge control valve driver 41 drives the paste discharge control valve 19 to perform the opening and closing thereof, thereby controlling the control air to be supplied to the paste applying nozzle 18 and conducting the opening and closing of the paste applying nozzle 18.

A Z-axis motor driver 42, a Y-axis motor driver 43 and an X-axis motor driver 44 drive the Z-axis motor 14a, Y-axis motor 11a and X-axis motor 12a of the moving table 10, respectively. A bonding head driver 45 drives the bonding head 4 whereby the chip 3 is bonded. A storing unit 46 stores the programs needed in operating and processing of each respective function and also data on paste applying patterns. A controller 47 controls each respective function based on the programs stored in the storing unit 46. An operation input unit 48 is such entering means as a keyboard, mouse and the like whereby a feeding of control commands and data is carried out. A display unit 49 is a display device to display a picture screen when an operation input is done.

Next, a description is given to the process function of paste applying process performed by a die bonding machine with reference to FIG. 3. In FIG. 3, each respective unit surrounded by a box 46 shows what is stored as the data in the storing unit 46 of FIG. 2. Out of the units as shown in FIG. 3, an input processing unit 50, a display processing unit 51, a drawing pattern selecting unit 54, a speed pattern computing unit 55, a paste discharge amount calculating unit 56 and a drawing processing unit 58 indicate what is handled by the controller 47 of FIG. 2.

First, a description is made on each respective unit constituting the storing unit 46. A chip size storing unit 52 stores the chip size data, i.e., data on the width and length of the chip 3 that is an object to be bonded. A drawing pattern setting table 53 stores the data on a pattern of paste applying by making a drawing that is set up in accordance with chip sizes. In other words, the drawing pattern setting table 53 serves as a drawing pattern storing means to store drawing patterns. The drawing pattern selecting unit 54 (a drawing pattern selecting means) selects a suitable drawing pattern corresponding to a chip to be bonded based on the chip sizes stored in the chip size storing unit 52 and the data on drawing patterns stored in the drawing pattern setting table 53.

The speed pattern computing unit 55 derives by computation a speed pattern to move a paste applying nozzle 18 based on the selected drawing pattern. Also, the speed pattern computing unit 55 derives the drawing time needed in making a predetermined drawing based on the selected drawing pattern. A speed pattern storing unit 57 stores the speed patterns and drawing time derived by computation by the speed pattern computing unit 55. The speed pattern computing unit 55 and speed pattern storing unit 57 serve as a speed pattern setting means to set up speed patterns.

The paste discharge amount calculating unit 56 derives by calculation a paste discharge amount needed by the dispenser 16 to apply a required paste applying amount via the paste applying nozzle 18 based on the paste applying amount determined by the drawing time derived by the speed pattern computing unit 55, the chip sizes stored in the chip size storing unit 52 and the like. A paste discharge amount storing unit 59 stores the data in the calculated paste discharge amount. At the time of performing applying the paste according to a drawing, the data on the paste discharge amount is read out of the paste discharge amount storing unit 59 and sent to the drawing processing unit 58.

The drawing processing unit 58 makes the paste applying nozzle 18 move by driving the X-axis motor driver 44, Y-axis motor driver 43, Z-axis motor driver 42, paste discharge control valve driver 41 and dispenser driver 40 based on the data on speed patterns and paste discharge amounts and at the same time has the paste 7 discharged from the paste applying nozzle 18, thereby performing the process of applying the paste 7 by making a drawing. Therefore, the drawing processing unit 58 acts as a controlling means to control a moving means based on a drawing pattern.

The input processing unit 50 processes an operation input signal received from the operation- input unit 48, feeds a control command to each respective unit and also performs data entry in the storing unit 46. The display processing unit 51 processes the data stored in the storing unit 46 and has various kinds of guide pictures displayed on the display unit 49.

Here, a description is given to the drawing pattern setting table 53. The drawing pattern setting table 53 indicates chip sizes and a classification of the drawing patterns set up in accordance with the chip sizes. As the size of a chip increases, the bonding area for the chip is increased with a resulting increase in the amount of paste needed to bond the chip. There is a correlation between the amount of paste to be applied and the drawing pattern and, therefore, when a chip size is designated, a suitable drawing pattern can be automatically selected, thereby allowing the amount of paste to be applied in bonding the chip of the designated size to be found out easily, provided that the classification of the drawing patterns set up in accordance with the chip sizes is established in advance. Next, a description is made on a specific example of the drawing pattern setting table illustrating the classification of the drawing patterns set up in accordance with the chip sizes with reference to FIG. 4.

As FIG. 4 shows, when a chip size is less than 3 mm, the required amount of applied paste is ensured by simply applying a paste 7 in a dot-like pattern (referred to as a "center dot pattern") on the center point O of an paste applying area. An adjustment of the amount of paste to be applied is made by a paste applying time period, during which a paste is applied, while the paste applying nozzle being brought to a standstill on the center point O. When a chip size becomes larger, falling in a range of 3 mm to 7 mm, what is selected is a drawing pattern formed by combining the foregoing pattern and paste applying diagonal lines L1 and L2 crossing each other at right angles (referred to as a "diagonal cross-shaped pattern with a center dot"). An adjustment of the amount of paste to be applied is made by adjusting the amount of paste applied on the center dot O.

Further, when a chip size becomes still larger, falling in a range of 7 mm to 17 mm, a pattern formed by combining the foregoing pattern and paste applying lines L3 extending vertically and L4 extending horizontally, both crossing each other at right angles, (referred to as a "double cross-shaped pattern with a center dot") is selected. When a chip size is 17 mm or larger, a drawing pattern formed by attaching an arrow-head-shaped paste applying line L5 to each respective tip of the foregoing cross-shaped paste applying lines L3 and L4 (referred to as "snow star pattern") is selected. With those patterns of above also, an adjustment of the amount of paste to be applied is made by adjusting the amount of paste applied on the center dot O.

Once a chip size is designated, a suitable drawing pattern to gain the required amount of paste to be applied for bonding a chip of the designated size can be automatically selected by having the drawing pattern setting table as described above prepared beforehand.

Next, a description is made on a drawing pattern determining process with reference to FIG. 5. First, a chip size is read out of the chip size storing unit 52. (ST1) Then, a drawing pattern to be used is selected at the speed pattern computing unit 55 with reference to the drawing pattern setting table 53. (ST2) A speed pattern is then prepared at the speed pattern computing unit 55 based on the selected drawing pattern. (ST3) After that, the discharge amount of a paste 7 is derived by calculation in the paste discharge amount calculating unit 56 from the drawing time and required amount of paste to be applied derived by calculation based on the speed pattern and stored in the paste discharge amount storing unit 59. (ST4) This brings the drawing pattern determining process to an end.

FIG. 6 deals with an example of the speed patterns set up in the foregoing drawing pattern determining process. The drawing pattern as used here is formed of paste applying diagonal lines (straight-line segments AC and BD) crossing each other at right angles as FIG. 7 shows. The drawing pattern of above is made with one drawing stroke starting at the center point O, passing the mid-points of A, B, C and D on the paste applying line and returning to the center point O, thereby completing the process of making a paste applying pattern drawing.

In this paste applying pattern drawing, the paste applying nozzle 18 moves by passing O-A-C-O-B-D-O in this order. At this time, each of the moving axes X and Y (i.e., the X-axis motor 12a and Y-axis motor 11a, respectively) is driven according to the speed patterns as FIG. 6 shows. More specifically, each respective moving axis is driven based on a trapezoidal speed pattern indicating that acceleration and deceleration are repeated between the mid-points existing in the span extending from the paste application starting point O to the paste application ending point O.

The Z-axis, whereby the paste applying nozzle 18 is moved up and down, makes an ascending movement, only when the paste applying process is ended. At the time of ascending of the paste applying nozzle 18, the paste 7 is discharged to perform a dot-shaped application of the paste 7 while the paste applying nozzle 18 being suspended in motion over the center point O as FIG. 7(b) shows. By adjusting the amount of paste to be applied at the center point O, the overall amount of paste to be applied is adjusted.

As described in above, once a chip size is designated, the present invention allows a suitable paste applying drawing pattern corresponding to the chip size to be selected, thereby having the speed pattern, which corresponds to the drawing pattern, set up automatically. Accordingly, it is no longer required of the drawing data to be set up every time the kinds and sizes of chips are changed, thus allowing an paste application to be performed always properly and with excellent operability to ensure satisfactory bonding quality.

Second Exemplary Embodiment

Figure 8:
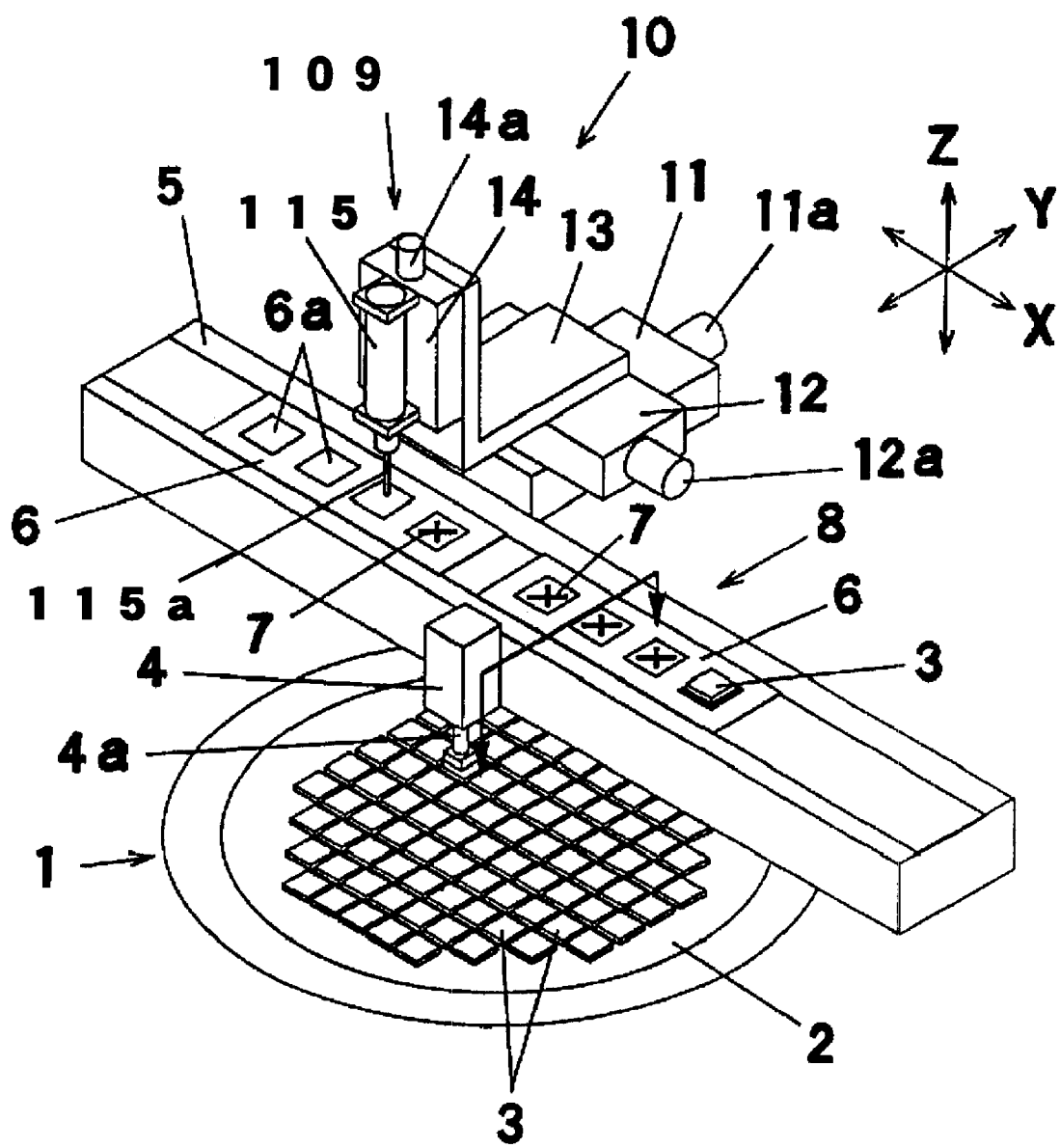
FIG. 8 is a perspective view of a die bonding machine employing a bonding paste applicator in a second exemplary embodiment of the present invention.
Figure 10:
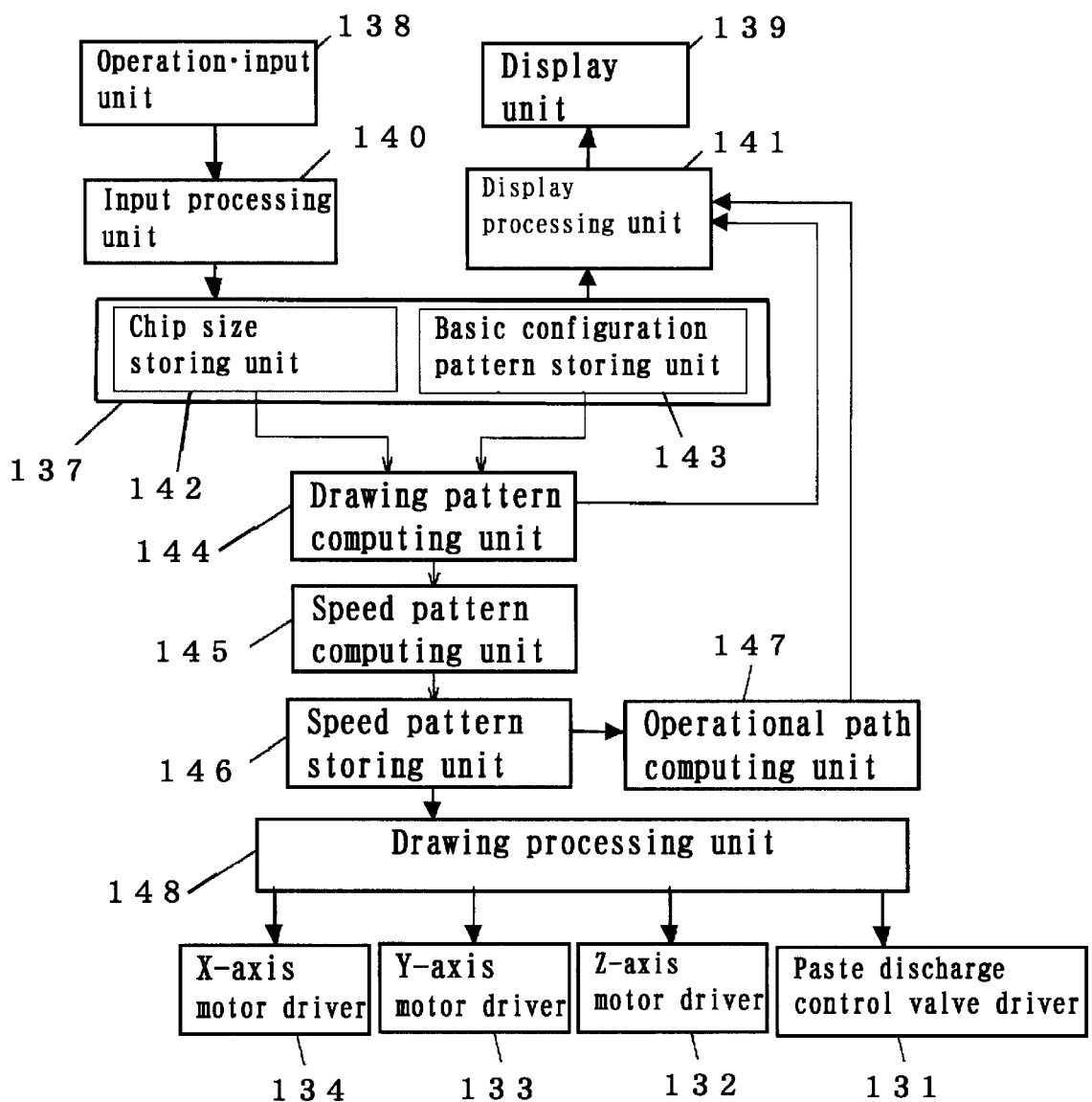
FIG. 10 is a functional block diagram to show the paste applying process of the die bonding machine of FIG. 8.
Figure 11:
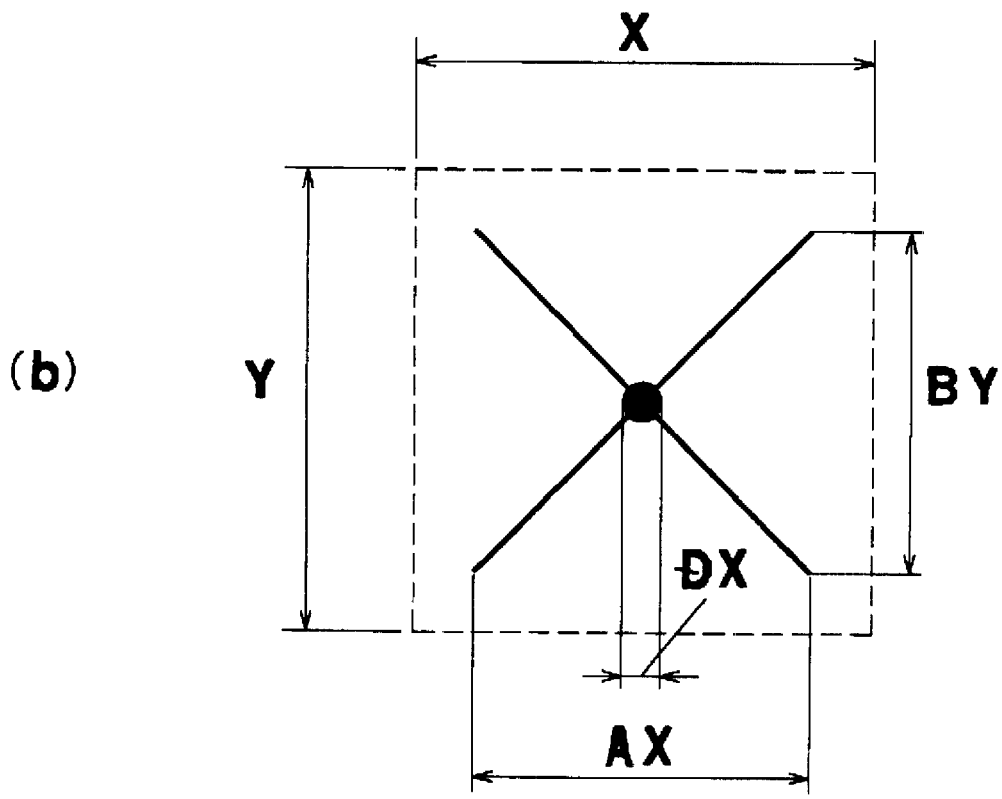
FIG. 11 shows illustrations of the basic configuration patterns for drawing patterns as used in the die bonding machine of FIG. 8.
Figure 12:
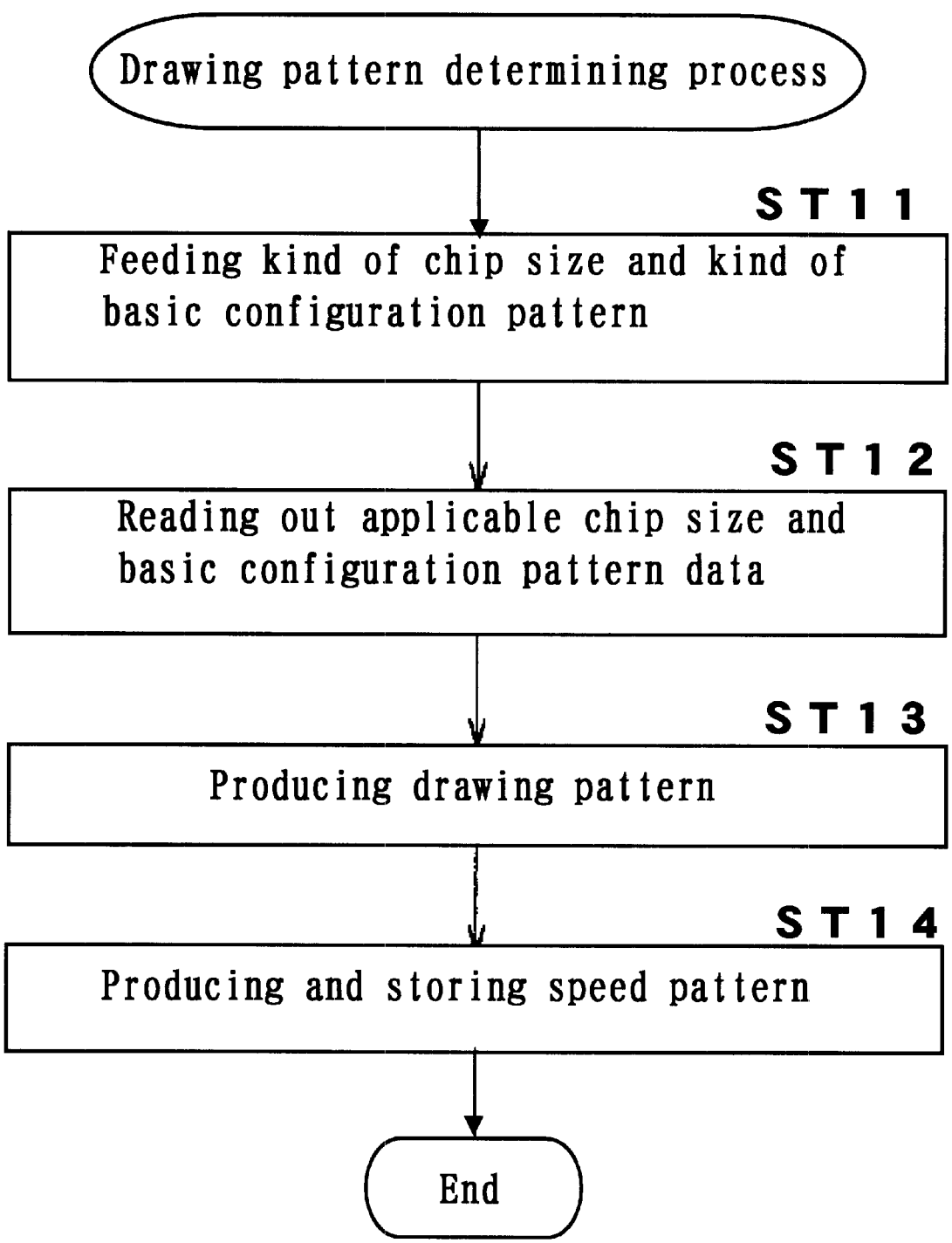
FIG. 12 is a flowchart of the drawing pattern setting process of the bonding paste applicator in the second exemplary embodiment of the present invention.
Figure 13:
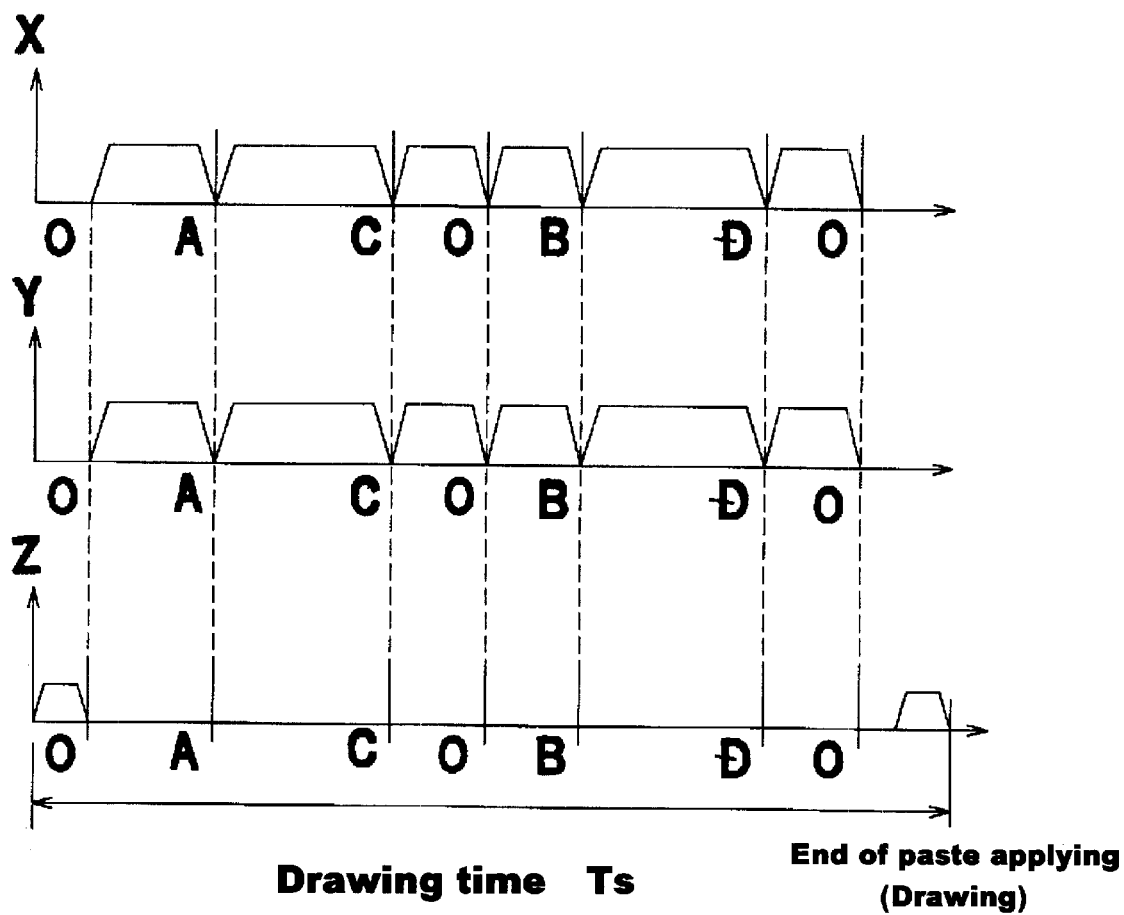
FIG. 13 is a diagram to show the speed pattern as used in making a drawing pattern for the bonding paste applicator in the second exemplary embodiment of the present invention.

Next, a description is given to a bonding paste applicator in a second exemplary embodiment of the present invention with reference to drawings. FIG. 8 is a perspective view of a die bonding machine employing the bonding paste applicator in the second exemplary embodiment of the present invention. FIG. 9 is a block diagram to show how the control system of the die bonding machine of FIG. 8 is structured. FIG. 10 is a functional block diagram to show the paste applying process of the die bonding machine of FIG. 8. FIG. 11 shows illustrations of the basic configuration patterns for drawing patterns as used in the die bonding machine of FIG. 8. FIG. 12 is a flowchart of the drawing pattern setting process of the bonding paste applicator in the second exemplary embodiment of the present invention. FIG. 13 is a diagram to show the speed pattern as used in making a drawing pattern for the bonding paste applicator in the second exemplary embodiment of the present invention. FIG. 14(a) is a plan view of the paste applying area of the bonding paste applicator in the second exemplary embodiment of the present invention. FIG. 14(b) is a cross-sectional view of the paste applying area of the bonding paste applicator in the second exemplary embodiment of the present invention.

First, a description is made on the structure of the die bonding machine with reference to FIG. 8. As FIG. 8 shows, a wafer sheet 2 is held by a holding table (not shown in FIG. 8) in a chip feeder 1. Many chips 3, each being a semiconductor element, are placed on the wafer sheet 2 by sticking on the surface thereof. On the side of the chip feeder 1 is installed a conveyor 5, which transports a lead frame 6 and positions the lead frame 6 to a paste applying position and also to a bonding position. Above the chip feeder 1 is located a bonding head 4, which is moved horizontally as well as vertically by a moving means that is not shown in FIG. 8.

A paste applying unit 109 is disposed on the side of the conveyor 5. The paste applying unit 109 is structured to have a dispenser's syringe 115, which is provided with a paste applying nozzle 115a, installed on a moving table 10. The moving table 10 is structured to have an X-axis table 12 stacked on a Y-axis table 11 and further to have a Z-axis table 14 stacked on the X-axis table 12 with an L-shaped bracket 13 disposed therebetween, all the foregoing elements being joined together vertically. The Y-axis table 11, X-axis table 12 and Z-axis table 14 are provide with a Y-axis motor 11a, X-axis motor 12a and Z-axis motor 14a, respectively.

When the X-axis motor 12a, Y-axis motor 11a and Z-axis motor 14a are activated to rotate, the syringe 115 is moved on the lead frame 6 horizontally and vertically. Inside of the syringe 115 is contained a paste 7 for attaching chips 3 by adhesion on the lead frame 6. The inner part of the syringe 115 is pressurized by air and, therefore, by opening a valve 115b that opens and closes the paste applying nozzle 115a (refer to FIG. 9), the paste 7 is discharged through an orifice of the paste applying nozzle 115a.

A chip bonding location, where a chip 3 is bonded on the upper surface of the lead frame 6, is included in a paste applying area 6a, where the paste 7 is applied. By having the paste applying nozzle 115a moved while the paste 7 being discharged therefrom, the paste 7 is applied in an X-letter shaped paste applying pattern within the paste applying area 6a formed at the chip mounting position on the surface of the lead frame 6. The syringe 115, paste applying nozzle 115a and an air pressure supplying means to provide the syringe 115 with an air pressure constitute a paste discharging means. The moving table 10 acts as a moving means to move the orifice of the paste applying nozzle 115a.

After the paste 7 is applied as described in above, the lead frame 6 is carried on the conveyor 5 to a bonding position 8 and fixed in position there. The chip 3 picked up at the chip feeder 1 by a nozzle 4a of the bonding head 4 is placed on the paste 7 applied in the paste applying area 6a and bonded there.

Next, a description is given to how the control system of the die bonding machine is structured with reference to FIG. 9. As FIG. 9 shows, air supplied from an air source 120 is fed to the inside of the syringe 115 via a regulator 121 which allows a pressure setting to be controlled remotely. By controlling the regulator 121 via a controller 136, the air pressure supplied to the syringe 115 is adjusted, thereby allowing the amount of paste discharged from the paste applying nozzle 115a to be controlled. A paste discharge control valve driver 131 drives the valve 115b that opens and closes the paste applying nozzle 115a. By controlling the paste discharge control valve driver 131 through the controller 136, the paste 7 discharged from the paste applying nozzle 115a is allowed to be interrupted. Instead of controlling the air pressure at the regulator 121 via the controller 136, the air pressure can also be adjusted manually to obtain a predetermined discharge amount of paste.

An X-axis motor driver 134, a Y-axis motor driver 133 and a Z-axis motor driver 132 drive the X-axis motor 12a, Y-axis motor 11a and Z-axis motor 14a of the moving table 10, respectively. By controlling the controller 136 acting as a controlling means, the X-axis motor driver 134, Y-axis motor driver 133 and Z-axis motor driver 132 are controlled, thereby having the movement of the moving table 10 controlled.

A storing unit 137 stores data on the paste applying operation of the paste applying nozzle 115a such as a paste applying start point, a paste applying end point and positions of passing points for the paste applying nozzle 115a to follow while in the paste applying operation, which are set up in the paste applying area 6a, the moving speed pattern and discharge amount of paste of the paste applying nozzle 116a and the like. Based on the data stored in the storing unit 137, the controller 136 controls the moving operation of the paste applying nozzle 115a driven by the moving table 10 and the paste discharge operation of the paste applying nozzle 115a caused by the syringe 115, thereby allowing the paste 7 to be applied in the paste applying area 6a with a predetermined drawing pattern.

A bonding head driver 135 drives the bonding head 4 under the control of the controller 136. An operation input unit 138 means an input device such as a keyboard, mouse and the like, and carries out an operation to feed operation commands and numerical data. A display unit 139 is a monitor device and carries out displaying of a guide screen at the time of data input.

Next, a description is given to the process function of the paste applying process performed by a die bonding machine with reference to FIG. 10. In FIG. 10, each respective unit situated within a box 137 corresponds together to the storing unit 137 as FIG. 9 shows and, out of the units as FIG. 10 shows, an input processing unit 140, a display processing unit 141, a drawing pattern computing unit 144, a speed pattern computing unit 145, an operational path computing unit 147 and a drawing processing unit 148 indicate what is handled by the controller 136 of FIG. 9.

First, a description is made on each respective unit constituting the storing unit 137. A chip size storing unit 142 stores the size data of each respective chip 3 that makes an object to be bonded, i.e., data on the width and length of each respective chip 3. A basic configuration pattern storing unit 143 stores data needed in specifying kinds of drawing patterns from the basic configuration patterns such as a center dot pattern, cross-shaped pattern, asterisk pattern, snow star pattern and the like and also numerical data such as a ratio of a line segment constituting each respective basic configuration pattern to a chip size and the like.

Here, a description is given to a drawing pattern. In die bonding, the required amount of paste to be applied is different by the kind and size of each respective chip to be bonded. As the size of a chip increases, the bonding area needed for the chip increases accordingly, resulting in an increase in the required amount of paste. Furthermore, depending on the kind of a chip, a paste applying density (the amount of paste to be applied per unit area) has to be determined properly.

When the amount of paste discharged from a nozzle is kept constant, the amount of paste to be applied can be considered generally proportionate to the length of a paste applying line constituting a drawing pattern since the amount of paste to be applied is generally proportionate to the paste applying length. The length of a paste applying line per unit area varies by an extent of complexity of a drawing pattern and, therefore, when a desired paste applying density is given, it is necessary for a drawing pattern to be determined properly according to the paste applying density desired. In the present exemplary embodiment, the drawing pattern is determined according to a combination of the basic configuration patterns used in the drawing pattern and the chip size. In other words, once a chip size is given by specifying the kind of a chip to be bonded and further applicable basic configuration patterns are specified accordingly, a drawing configuration drawing length is determined in a specific manner, thereby allowing a drawing pattern with a proper paste applying density and a required amount of paste to be obtained.

Here, a few examples of the basic configuration patterns are given as follows:

FIG. 11(a) shows examples of the basic configuration patterns applied to a rectangular chip starting from the simplest pattern of simply applying a paste 7 in a dot-like pattern on the center point O of an paste applying area (a center dot pattern), a drawing pattern formed by combining the foregoing pattern and paste applying diagonal lines L1 and L2 that cross each other at right angles (a diagonal cross-shaped pattern with a center dot), a drawing pattern formed by combining the foregoing pattern and paste applying lines L3 extending vertically and L4 extending horizontally, both crossing each other at right angles (an asterisk pattern with a center dot), a drawing pattern formed by attaching an arrow-head-shaped paste applying line L5 to each respective tip of the foregoing crossing paste applying lines L3 and L4 (a snow star pattern) and the like.

FIG. 11(b) shows configuration data of the diagonal cross-shaped pattern with a center dot out of the foregoing patterns. The configuration data are provided in the form of relative ratios against the dimensions X and Y of a chip, i.e., in the form of dimensionless numerical data. For example, dimensionless numerals A, B and D are provided as the data to indicate the distances AX and BY between the respective end points of the cross-shaped paste applying lines and the diameter DX of the dot-like drawing pattern located in the center, respectively. As a result, the actual positions and dimensions of the paste applying lines can be specified by combining these numerical data and the data X and Y indicating the size of the foregoing chip.

In other words, a combination of these basic configuration patterns and chip sizes allows the specific dimension of each respective paste applying line as well as the drawing pattern to be determined. In addition, the dimensionless numerals indicating the relative ratios of the line segments constituting each respective drawing pattern are changeable on a display screen by numerical data entry and a further complex drawing pattern can be set up in accordance with the object to be bonded. By having the basic configuration patterns as such prepared in advance, not only the total amount of paste to applied but also the paste applying density can be selected arbitrarily, resulting in a benefit of enabling the most suitable drawing pattern to be selected according to the chip to be bonded.

The drawing pattern computing unit 144 derives by computation a drawing pattern based on the chip size stored in the chip size storing unit 142, chip size stored in the basic configuration pattern storing unit 143 and data on the basic configuration patterns. In other words, with the dimensions of a chip to be bonded and the kind of a drawing pattern to be adopted specified, an actual drawing pattern is derived by computation. Therefore, it can be said that the drawing pattern computing unit 144 acts as a drawing pattern producing means to produce a drawing pattern based on the applicable basic configuration pattern and the size of a chip to be bonded.

In the production of a drawing pattern, the path processing relative to the details at a point of rolling back and a corner point of a drawing pattern path (such as setting up an R-letter shaped path at a rolling back point, for example) can also be carried out. By applying data processing to the data of this drawing pattern in the display processing unit 141, it is arranged that the drawing pattern is allowed to be confirmed on the monitor screen of the display unit 139.

The speed pattern computing unit 145 derives by computation a speed pattern whereby the paste applying nozzle 115a is moved for each of the X-axis and Y-axis components that constitute the moving path of the paste applying nozzle 115a based on the drawing pattern derived by computation. A speed pattern storing unit 146 stores the speed pattern derived by computation in the speed pattern computing unit 145. The speed pattern computing unit 145 and speed pattern storing unit 146 constitute a speed pattern setting means to set up a speed pattern.

Based on the stored speed pattern data read out, the operational path computing unit 147 performs a path computation, thereby allowing a path data indicating the actual moving path to be obtained. This path data is data processed in the display processing unit 141, thereby enabling the same path as the actual moving path of the paste applying nozzle 115a to be displayed at the display unit 139.

The drawing processing unit 148 moves the paste applying nozzle 115a by driving the X-axis motor driver 134, Y-axis motor driver 133, Z-axis motor driver 132 and paste discharge control valve driver 131 in synchronization with one another and also has the paste 7 discharged from the paste applying nozzle 115a, thereby carrying out the paste applying process by making a drawing.

The X-axis motor driver 134, Y-axis motor driver 133 and Z-axis motor driver 132 drive the X-axis motor 12a, Y-axis motor 11a and Z-axis motor 14a based on the speed pattern for the X-axis component, speed pattern for the Y-axis component and speed pattern for the Z-axis pattern stored in the speed pattern storing unit 146, respectively. With the present exemplary embodiment, the X-axis motor driver 134, Y-axis motor driver 133 and Z-axis motor driver 132 constitute a driving means to drive the moving means based on the established speed pattern.

The input processing unit 140 processes an operational input signal fed from the operation input unit 138 and sends a control command to respective units and also performs a data write operation to the storing unit 137. The display processing unit 141 processes the data stored in the storing unit 137 and displays various guiding screens on the display unit 139.

Next, a description is given to a drawing pattern determining process with reference to FIG. 12. When a drawing pattern is determined, the kind of a chip to be bonded and the kind of a basic configuration pattern to be selected are furnished from the operation-input unit 138. (ST11) Then, the applicable chip size is read from the chip size storing unit 142 and the configuration data of the applicable basic configuration pattern, i.e., the numerical data indicating the relative positions of the paste applying lines constituting the drawing pattern is read from the basic configuration pattern storing unit 143. (ST12) As FIG. 11 shows, here provided is an example where the dimensions of the sides X and Y of a rectangular chip, which makes a chip to be bonded, are given and the aforementioned cross-shaped pattern with a center dot is selected as the basic configuration pattern.

Then, a drawing pattern is produced by computation in the drawing pattern computing unit 144 based on the configuration data of the basic configuration pattern and chip size. (ST13) Here, the specific dimensions that determine the position of each respective paste applying line are obtained, thereby allowing the outlines of the drawing pattern to be determined. It is also possible for the drawing pattern produced by computation to be displayed on the monitor screen of the display unit 139. Whenever it becomes necessary for the produced drawing pattern to be corrected partially, the relative position of each respective paste applying line against one another, length ratio of each respective paste applying line and the like are made to be amendable.

Subsequently, a speed pattern is produced by computation in the speed pattern computing unit 145 based on the selected drawing pattern and stored there. (ST14) Accordingly, a specific speed pattern with an actual acceleration/deceleration condition added at the time of axis driving is produced for each respective axis of the driving axes that move the paste applying nozzle 115a. FIG. 13 shows the speed patterns set up in the foregoing drawing pattern determining process. The drawing pattern of above is made with one drawing stroke starting at the center point O, passing the mid-points of A, B, C and D on the paste applying line and returning to the center point O, thereby completing the process of making a paste applying pattern drawing.

In this paste applying pattern drawing, the paste applying nozzle 18 moves by passing O-A-C-O-B-D-O in this order. At this time, each of the moving axes X and Y (i.e., the X-axis motor 12a and Y-axis motor 11a, respectively) is driven according to the speed patterns as FIG. 13 shows. More specifically, each respective moving axis is driven based on a trapezoidal speed pattern indicating that acceleration and deceleration are repeated between the mid-points existing in the span extending from the paste application starting point O to the paste application ending point O.

The Z-axis to have the paste applying nozzle 115a moved up and down makes a descending movement, only when the paste applying process is started, and makes an ascending movement, only when the paste applying process is ended. Just before the paste applying nozzle 115a makes an ascending movement, the paste 7 is discharged to perform a dot-shaped application of paste 7 while the paste applying nozzle 115a being suspended in motion over the center point O as FIG. 14(b) shows. By adjusting the amount of paste 7 to be applied to the center point O, the overall amount of paste 7 to be applied is adjusted.

It is also possible for the operation path derived by computation based on the produced speed pattern to be displayed on the monitor screen of the display unit 139 for a path confirmation. If anything improper is not found with respect to the displayed path, the speed pattern prepared based on the applicable drawing pattern is stored as the practical operations data for the paste applying work, thereby bringing the drawing pattern determining process to an end.

As described in above, once the size of a chip to be bonded and the kind of required drawing configuration (basic configuration pattern) are designated, the present invention allows a suitable paste applying drawing pattern corresponding to the chip size to be selected, thereby having the speed pattern corresponding to the drawing pattern set up automatically. Accordingly, it is no longer required of the drawing data to be set up every time the kinds and sizes of chips are changed, thus allowing an application of paste to be performed always properly and with excellent operability to ensure satisfactory bonding quality.

Furthermore, according to the present invention, a drawing pattern is selected in accordance with the size of a chip to be bonded and a speed pattern for the means to move a nozzle is set up based on the selected drawing pattern and, therefore, the drawing patterns are no longer required to be set up again every time the kinds and sizes of chips are changed, thereby allowing a proper paste applying process to be performed all the time with excellent operability.

According to the present invention, the drawing pattern used in controlling the moving means to move a paste applying nozzle is produced in accordance with the basic configuration patterns for drawing patterns and the sizes of chips and the speed pattern used in the foregoing moving means is set up based on the produced drawing pattern, thereby allowing a proper drawing pattern corresponding to the kind and size of a chip to be bonded to be set up with excellent operability and enabling a suitable paste applying process to be carried out efficiently.

What is claimed is:

1. A method of applying a bonding paste to a substrate utilized in the process of mounting a chip to the substrate, said method comprising the steps of:

automatically selecting a drawing pattern defining the pattern of said paste deposited on said substrate on the basis of the size of said chip to be mounted; and determining a speed pattern for controlling the movement of a paste applying nozzle depositing said bonding paste in accordance with said selected drawing pattern.

2. A method of applying a bonding paste to a substrate utilized in the process of mounting a chip to the substrate according to claim 1, further comprising the step of storing a plurality of drawing patterns in a memory device, each of said plurality of drawing patterns corresponding to a given chip size, said selected drawing pattern being one of said plurality of drawing patterns.

3. A method of applying a bonding paste to a substrate utilized in the process of mounting a chip to the substrate according to claim 1, further comprising the step of determining the size of the chip to be mounted to the substrate.

4. A method of applying a bonding paste to a substrate utilized in the process of mounting a chip to the substrate according to claim 3, further comprising the step of storing chip size data for a plurality of chips in memory.

5. A method of applying a bonding paste to a substrate utilized in the process of mounting a chip to the substrate according to claim 4, wherein said chip size data includes a length dimension and a width dimension of the chip.

6. A method of applying a bonding paste to a substrate utilized in the process of mounting a chip to the substrate according to claim 5, further comprising the step of determining the amount of bonding paste required to complete said drawing pattern on the basis of the speed pattern.

7. A method of applying a bonding paste to a substrate utilized in the process of mounting a chip to the substrate, said method comprising the steps of:

identifying the chip to be mounted on the substrate;

automatically selecting a basic drawing pattern for depositing the bonding paste on the basis of the identified chip;

determining the size of the identified chip;

determining an actual drawing pattern for depositing the bonding paste by adjusting the basic drawing pattern on the basis of the size of the identified chip;

determining a speed pattern for controlling the movement of a paste applying nozzle depositing said bonding paste in accordance with the actual drawing pattern; and discharging the bonding paste in accordance with the speed pattern.

8. A method of applying a bonding paste to a substrate utilized in the process of mounting a chip to the substrate according to claim 7, further comprising the step of storing a plurality of basic drawing patterns in a memory device, each of said plurality of basic drawing patterns corresponding to a given chip size.

9. A method of applying a bonding paste to a substrate utilized in the process of mounting a chip to the substrate according to claim 7, further comprising the step of storing chip size data for a plurality of chips in memory.

10. A method of applying a bonding paste to a substrate utilized in the process of mounting a chip to the substrate according to claim 9, wherein said chip size data includes a length dimension and a width dimension of the chip.

11. A method of applying a bonding paste to a substrate utilized in the process of mounting a chip to the substrate according to claim 7, further comprising the step of determining the amount of bonding paste required to complete said actual drawing pattern on the basis of the speed pattern.

* * * * *